United States Patent
Nakamura et al.

(10) Patent No.: US 10,017,854 B2
(45) Date of Patent: Jul. 10, 2018

(54) GAS BARRIER FILM AND METHOD OF MANUFACTURING GAS BARRIER FILM

(71) Applicant: FUJIFILM Corporation, Tokyo (JP)

(72) Inventors: Seigo Nakamura, Kanagawa (JP); Yoshihiko Mochizuki, Kanagawa (JP); Atsushi Mukai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/270,001

(22) Filed: Sep. 20, 2016

(65) Prior Publication Data
US 2017/0009339 A1  Jan. 12, 2017

Related U.S. Application Data

(63) Continuation of application No. PCT/JP2015/051833, filed on Jan. 23, 2015.

(30) Foreign Application Priority Data

Mar. 24, 2014  (JP) .................................. 2014-059541

(51) Int. Cl.
*C23C 16/40* (2006.01)
*C23C 16/505* (2006.01)
(Continued)

(52) U.S. Cl.
CPC .......... *C23C 16/401* (2013.01); *C23C 16/308* (2013.01); *C23C 16/345* (2013.01); *C23C 16/505* (2013.01)

(58) Field of Classification Search
CPC ... C23C 16/401; C23C 16/308; C23C 16/505; C23C 16/345
See application file for complete search history.

(56) References Cited

U.S. PATENT DOCUMENTS

| 2011/0064932 A1* | 3/2011 | Takahashi ............. C23C 16/345 428/220 |
| 2015/0050478 A1 | 2/2015 | Mochizuki et al. |
| 2016/0172625 A1* | 6/2016 | Mukai ................. H01L 51/0097 428/336 |

FOREIGN PATENT DOCUMENTS

| EP | 2309022 | 4/2011 |
| JP | 2006-68992 | 3/2006 |

(Continued)

OTHER PUBLICATIONS

Da Silva Sobriinho et al, ("Plasma-deposited silicon oxide and silicon nitride films on poly(ethylene terephthalate) A multitechnique study of the interphase regions"), Journal of Vacuum Science & Technology A, vol. 16, pp. 2021-2030, 1998.*

(Continued)

*Primary Examiner* — Jonathan C Langman
(74) *Attorney, Agent, or Firm* — JCIPRNET

(57) ABSTRACT

A gas barrier film includes a substrate film and an inorganic layer, in which the inorganic layer includes Si, N, H, and O, the inorganic layer includes a uniform region having a thickness of more than 5 nm at the center in a thickness direction, in the uniform region, a ratio of Si, N, H, and O is uniform and an O proportion is low, and either or both interface-contact regions of the inorganic layer are oxygen-containing regions in which the O proportion represented by the expression "O Proportion: (Number of O/Total Number of Si, N, and O)×100%" increases in a direction from the uniform region side to an interface and in which a variation of the O proportion per unit thickness is 2%/nm to 8%/nm.

16 Claims, 1 Drawing Sheet

(51) Int. Cl.
*C23C 16/34* (2006.01)
*C23C 16/30* (2006.01)

(56) References Cited

FOREIGN PATENT DOCUMENTS

| JP | 2009196155 | | 9/2009 | | |
|----|---|---|---|---|---|
| JP | 2011-63851 | | 3/2011 | | |
| JP | 2011184703 | | 9/2011 | | |
| JP | 2013-203050 | | 10/2013 | | |
| JP | WO2015030178 | * | 3/2015 | ............... | B32B 9/00 |

OTHER PUBLICATIONS

Shim et al., "Silicon oxynitride gas barrier coatings on poly(ether sulfone) by plasma-enhanced chemical vapor deposition," Surface & Coatings Technology, Dec. 2007, pp. 2844-2849.
"Search Report of European Counterpart Application", dated Feb. 20, 2017, p. 1-p. 6.
"International Search Report (Form PCT/ISA/210) of PCT/JP2015/051833", dated Apr. 28, 2015, with English translation thereof, pp. 1-2.
"Written Opinion of the International Searching Authority of PCT/JP2015/051833", dated Apr. 28, 2015, with English translation thereof, pp. 1-8.

* cited by examiner

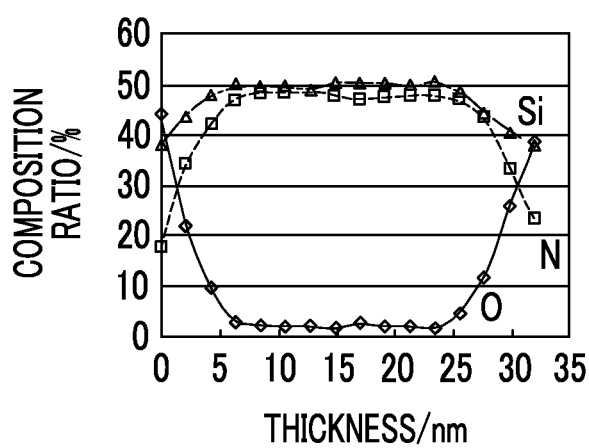

US 10,017,854 B2

GAS BARRIER FILM AND METHOD OF MANUFACTURING GAS BARRIER FILM

CROSS-REFERENCE TO RELATED APPLICATIONS

This application is a Continuation of PCT International Application No. PCT/JP2015/051833 filed on Jan. 23, 2015, which claims priority under 35 U.S.C § 119(a) to Japanese Patent Application No. 2014-059541 filed on Mar. 24, 2014. Each of the above application(s) is hereby expressly incorporated by reference, in its entirety, into the present application.

BACKGROUND OF THE INVENTION

1. Field of the Invention

The present invention relates to a gas barrier film and a method of manufacturing a gas barrier film. In particular, the present invention relates to a gas barrier film which includes an inorganic layer including Si, N, H, and O, and a method of manufacturing the gas barrier film.

2. Description of the Related Art

As a gas barrier film having a function of blocking water vapor, oxygen, and the like, a gas barrier film including an inorganic layer, in particular, including a silicon nitride layer or a hydrogenated silicon nitride layer is widely known, and this gas barrier film has been investigated in various ways in order to obtain satisfactory barrier properties, durability such as oxidation resistance, and bendability. In general, a dense and hard film has satisfactory barrier properties but is likely to crack. Therefore, it is difficult to obtain barrier properties and bendability at the same time.

In order to improve bendability and the like, JP2013-203050A discloses a technique of forming an interfacial mixed layer in an interface between an inorganic layer and an organic material substrate. In addition, JP2006-68992A discloses a technique of laminating a stress relaxation layer on a gas barrier layer to relax stress. JP2011-63851A discloses characteristics of a Fourier transform infrared absorption spectrum of a gas barrier film including silicon nitride as a major component and having satisfactory flexibility.

SUMMARY OF THE INVENTION

An object of the present invention is to provide a gas barrier film having satisfactory barrier performance and bendability at the same time and to provide a method of manufacturing a gas barrier film having satisfactory barrier performance and bendability at the same time.

In order to achieve the above-described object, the present inventors performed a detailed investigation on the formation of a hydrogenated silicon nitride layer in a gas barrier film. During this process, the present inventors found that barrier performance and bendability tend to vary depending on the composition change of the hydrogenated silicon nitride layer in a thickness direction. As a result of additional investigation, the present inventors found characteristics of an inorganic layer in which barrier performance and bendability are improved, thereby completing the present invention.

That is, the present invention provides the following <1> to <10>.

<1> A gas barrier film comprising a substrate film and an inorganic layer,
in which the inorganic layer includes Si, N, H, and O,
the inorganic layer includes a uniform region in which a ratio of Si, N, H, and O is uniform and an O proportion represented by the following expression is 10% or lower, at the center in a thickness direction,
either or both of interface-contact regions of the inorganic layer are oxygen-containing regions in which the O proportion represented by the following expression increases in a direction from the uniform region side to an interface and in which a variation of the O proportion per unit thickness is 2%/nm to 8%/nm, and
the uniform region has a thickness of more than 5 nm.
O Proportion: (Number of O/Total Number of Si, N, and O)×100%

<2> The gas barrier film according to <1>,
in which both interface-contact regions of the inorganic layer are the oxygen-containing regions.

<3> The gas barrier film according to <1> or <2>,
in which the oxygen-containing regions have a thickness of 4 nm to 15 nm.

<4> The gas barrier film according to any one of <1> to <3>,
in which the inorganic layer has a thickness of 15 nm to 65 nm.

<5> The gas barrier film according to any one of <1> to <3>,
in which the inorganic layer has a thickness of 20 nm to 40 nm.

<6> The gas barrier film according to any one of <1> to <5>,
in which a composition of the uniform region is represented by $SiN_xH_yO_z$, in which $0.8 \leq x \leq 1.1$, $0.7 \leq y \leq 0.9$, and $z < 0.1$.

<7> The gas barrier film according to <6>,
in which the composition of the uniform region is represented by $SiN_xH_yO_z$, in which $0.9 \leq x \leq 1.0$, $0.8 \leq y \leq 0.9$, and $z < 0.1$.

<8> The gas barrier film according to any one of <1> to <7>,
in which the inorganic layer has a density of 2.1 g/cm$^3$ to 2.4 g/cm$^3$.

<9> The gas barrier film according to any one of <1> to <8> comprising a barrier laminate including the inorganic layer and at least one organic layer.

<10> A method of manufacturing a gas barrier film which includes an inorganic layer including Si, N, H, and O, the method comprising
forming the inorganic layer by vapor deposition of silane, ammonia, and hydrogen which are in a plasma state by supplying a radio frequency,
in which either or both of a time period in which an electric power for supplying the radio frequency reaches a maximum value from 0 kW and a time period in which an electric power for supplying the radio frequency reaches 0 kW from a maximum value are 1.5 seconds to 7 seconds, and
during the time period of 1.5 seconds to 7 seconds, the electric power continuously varies.

According to the present invention, a gas barrier film having satisfactory barrier performance and bendability at the same time can be provided. The gas barrier film according to the present invention is superior in both barrier performance and bendability. The present invention also provides a method of manufacturing a gas barrier film having satisfactory barrier performance and bendability at the same time.

BRIEF DESCRIPTION OF THE DRAWINGS

FIG. 1 is a diagram showing the results of measuring variations of a Si proportion, a N proportion, and an O proportion in a thickness direction by XPS regarding an inorganic layer of a gas barrier film according to Example 5.

DESCRIPTION OF THE PREFERRED EMBODIMENTS

Hereinafter, the details of the present invention will be described.

In this specification, numerical ranges represented by "to" include numerical values before and after "to" as lower limits and upper limits. In this specification, "(meth)acrylate" represents "either or both of acrylate and methacrylate". The same shall be applied to "(meth)acrylic acid" or the like.

(Gas Barrier Film)

The present invention relates to a gas barrier film including a substrate film and an inorganic layer. The gas barrier film may include a barrier laminate which includes at least one inorganic layer and at least one organic layer on a substrate film.

A gas barrier film in which an inorganic layer is laminated, or an inorganic layer and an organic layer are laminated on a substrate film such as a plastic film is widely known. Typically, a dense inorganic layer has a gas barrier function (barrier properties), and an organic layer has a surface smoothing function or a stress relaxation function.

(Inorganic Layer)

As the density or thickness of the inorganic layer increases, the barrier properties of the inorganic layer increase, but the stress of the inorganic layer increases. Therefore, bendability tends to decrease. Due to a decrease in bendability, the inorganic layer may crack, or the inorganic layer and the organic layer may peel off from each other. Therefore, the gas barrier function may deteriorate. Focusing on the point that a region where oxygen atoms are detected is formed near an interface of a hydrogenated silicon nitride layer, the present inventors found that satisfactory barrier performance and bendability, which have a trade-off relationship in the related art, can be obtained at the same time by adjusting an O proportion (oxygen atom proportion) represented by the following expression in the above-described region to decrease in a direction from the interface to the center such that a variation of the O proportion per unit thickness is 2%/nm to 8%/nm.

O Proportion: (Number of O/Total Number of Si, N, and O)×100%

In this specification, the interface-contact region where the variation of the O proportion per unit thickness is 2%/nm to 8%/nm will also be referred to as "oxygen-containing region". An interface refers to a surface in which a thickness direction is a normal direction. Interfaces of the inorganic layer include an interface in a substrate film direction and an interface in a direction opposite to the substrate film. The interface in the direction opposite to the substrate film is an interface between the inorganic layer and an air layer, that is, the surface of the gas barrier film.

The oxygen-containing region may be present in only one of the interfaces of the inorganic layer, or may be present in both of the interfaces of the inorganic layer. In other words, the inorganic layer includes a uniform region and includes interface-contact regions and either or both of the interface-contact regions are oxygen-containing region. The thicknesses of the oxygen-containing regions in both of the interfaces may be 3 nm to 20 nm and is preferably 4 nm to 15 nm. The thicknesses of the oxygen-containing regions in the interface in the substrate film direction and the interface in the direction opposite to the substrate film may be the same as or different from each other.

In this specification, a thickness refers to an average thickness measured from an image of a cross-section of a layer or a film which is taken using a transmission electron microscope (TEM). However, the thicknesses of the oxygen-containing regions are values calculated based on the results of XPS which are measured while etching the inorganic layer. That is, the thicknesses of the oxygen-containing regions cannot be measured using a TEM and thus are determined based on the XPS profile. Specifically, the thicknesses of the oxygen-containing regions can be calculated based on the time period required to etch the inorganic layer at a fixed etching rate and the thickness of the inorganic layer which is measured using a TEM.

Although the present invention is not limited to a specific theory, it is presumed that the density, that is, the stress in the layer varies depending on the above-described change in the O proportion in the layer. The following is presumed. A rapid change in the O proportion causes a large change in the stress. In contrast, an excessively slow change in the O proportion causes an increase in the thickness of the inorganic layer to obtain barrier performance and thus causes an increase in the total thickness of the gas barrier film, which leads to an increase in the stress. The present inventors found that, in a case where the variation of the O proportion is in the above-described range, the stress is significantly relaxed.

The number of O, the number of Si, and the number of N described above refer to the number of oxygen atoms (O), the number of silicon atoms (Si), and the number of nitrogen atoms (N), respectively, which are detected by X-ray photoelectron spectroscopy (XPS). The variation of the O proportion in the thickness direction can be calculated using a method including: performing the XPS measurement on the inorganic layer while etching the inorganic layer from the interface; and measuring the thickness of the inorganic layer using a transmission electron microscope (TEM) before the etching.

The present inventors found that a satisfactory gas barrier function can be maintained by maintaining the thickness of a region having a low O proportion to be more than 5 nm at the center of a hydrogenated silicon nitride layer in the thickness direction. Specifically, the gas barrier function can be improved by providing a region in which a ratio of Si, N, H, and O is uniform and in which the O proportion is 10% or lower and preferably 5% or lower. In this specification, the region in which a ratio of Si, N, H, and O is uniform and in which the O proportion is low will be referred to as "uniform region". It is preferable that the thickness of the uniform region is 6 nm or more, 7 nm or more, 8 nm or more, 9 nm or more, or 10 nm or more.

In this specification, the ratio of Si, N, H, and O being uniform means that all the changes of the O proportion, and a Si proportion and a N proportion, which are represented by the following expressions, are within 5%.

Si proportion: (number of Si/total number of Si, N, and O)×100%

N proportion: (number of N/total number of Si, N, and O)×100%

When the composition of the uniform region is represented by $SiN_xH_yO_z$, it is preferable that $0.8 \leq x \leq 1.1$, $0.7 \leq y \leq 0.9$, and $z<0.1$, and it is more preferable that $0.9 \leq x \leq 1.0$, $0.8 \leq y \leq 0.9$, and $z<0.1$.

The composition of the uniform region can be obtained by Rutherford backscattering (RBS) and hydrogen forward scattering (HFS) spectrometry. The composition of a film including hydrogen can be analyzed using glow discharge optical emission spectrometer (GD-OES).

[Density]

The density of the inorganic layer is preferably 2.1 g/cm$^3$ to 2.4 g/cm$^3$. In a case where the density of the inorganic layer is low, barrier performance is low. In contrast, in a case where the density of the inorganic layer is excessively high, bendability deteriorates, and peeling or cracking may occur due to stress.

The density of the inorganic layer described in this specification is determined based on X-ray reflectivity (XRR). The calculation of the density by the XRR measurement may be performed by a simulation using software. The XRR measurement can be performed using, for example, ATX (manufactured by Rigaku Corporation). The simulation may be performed using, for example, analysis software GXRR (manufactured by Rigaku Corporation). It is assumed that the inorganic layer is a single layer. That is, the density refers to the average value of the inorganic layer density including the uniform region, the oxygen-containing region, and an intermediate region.

The inorganic layer can be formed using any method in which a desired thin film can be formed. Examples of the method of forming the inorganic layer include a physical vapor deposition (PVD) method such as a vapor deposition method, a sputtering method, or an ion plating method, various chemical vapor deposition (CVD) methods, and a liquid phase growth method such as a plating method or a sol-gel method. Among these, a plasma CVD method is preferable. The inorganic layer including Si, N, H, and O can be formed using a plasma CVD method in which as silane (SiH$_4$), ammonia (NH$_3$), and hydrogen (H$_2$) are used as raw material gases. In the plasma CVD method, the raw material gases are converted into a plasma state by supplying a direct current (DC), a radio frequency (RF), a microwave, or the like, and then are vapor-deposited on a substrate.

The O proportion in the oxygen-containing region of the inorganic layer can be controlled by adjusting a gas flow ratio, a pressure, an electric power, and the like. In particular, the variation of the O proportion can be controlled by changing an increase rate and/or a decrease rate of the electric power in the plasma CVD method. That is, as the time period in which the electric power in the plasma CVD method is increased to a preset value increases, the variation of the O proportion in the formed interface is small. In a case where the inorganic layer is formed using a single-wafer CVD device in which plasma is switched on and off every time, typically, after evacuation, the electric power for forming the RF to form the inorganic layer is increased from 0 kW to a preset value (maximum value; for example, 2.5 kW) within 1 second. In contrast, by continuously increasing the electric power within a long period of time of longer than 1 second, a region in which the variation of the oxygen atom proportion is 2%/nm to 8%/nm can be formed. The time period in which the electric power continuously increases from 0 kW to a maximum value, for example, to a preset value of 2.5 kW is preferably 1.5 seconds or longer, more preferably 1.5 seconds to 7 seconds, and still more preferably 1.5 seconds to 6 seconds. The control of the variation of the O proportion through the adjustment of the time period in which the electric power is increased and/or decreased is merely exemplary. Since the variation of the O proportion depends not only on the gas flow ratio and the pressure but also on device characteristics such as the size of an electrode or the distance between electrodes, conditions for obtaining the appropriate variation of the O proportion for each device may be found.

In a case where the inorganic layer is formed using a roll-to-roll method, typically, a plasma distribution is generated in a transport direction. In particular, at an end portion of an electrode, an electric field spreads wider than in a region near the center of the electrode, and thus the effect is the same as that in a case where the processing is performed at a relatively low electric power. The variation of the O proportion is determined based on the plasma distribution and the transport speed of a substrate (corresponding to the film formation time). Therefore, it is preferable that the plasma distribution and the transport speed are adjusted to obtain a desired variation of the O proportion. The plasma distribution can be adjusted, for example, by adjusting the gas flow rate, the pressure, or the distance between electrodes. In a case where a gas introducing portion is present near the center of an electrode, the plasma distribution can be widened by increasing the gas flow rate. In addition, as the pressure decreases, the mean free path of plasma gas increases, and thus the plasma distribution becomes wide. As the distance between electrodes increases, the plasma distribution becomes wide. Even in the roll-to-roll method, conditions for obtaining the appropriate variation of the O proportion for each device can be found based on film formation conditions and device characteristics.

The thickness of the single inorganic layer may be 15 nm to 65 nm and is preferably 20 nm to 40 nm. The inorganic layer may include a region other than the uniform region and the oxygen-containing region in the thickness direction. For example, the inorganic layer may include an intermediate region between the uniform region and the oxygen-containing region.

(Substrate Film)

In the gas barrier film, typically, a plastic film is used as the substrate film. The material, thickness, and the like of the plastic film to be used are not particularly limited as long as the barrier laminate can be held on the plastic film. For example, the plastic film can be appropriately selected according to the intended use. Specific examples of the plastic film include thermoplastic resins such as a polyester resin, a methacrylic resin, a methacrylic acid-maleic acid copolymer, a polystyrene resin, a transparent fluororesin, polyimide, a fluorinated polyimide resin, a polyamide resin, a polyamide imide resin, a polyether imide resin, a cellulose acylate resin, a polyurethane resin, a polyether ether ketone resin, a polycarbonate resin, alicyclic polyolefin resin, a polyarylate resin, a polyethersulfone resin, a polysulfone resin, a cycloolefin copolymer, a fluorene ring-modified polycarbonate resin, an alicyclic modified polycarbonate resin, a fluorene ring-modified polyester resin, or an acryloyl compound.

The thickness of the substrate film is preferably 10 μm to 250 μm and more preferably 20 μm to 130 μm.

(Barrier Laminate)

The gas barrier film may include a barrier laminate which includes at least one inorganic layer and at least one organic layer. In the barrier laminate, two or more organic layers and two or more inorganic layers may be alternately laminated. In addition, the barrier laminate may include another constituent layer in addition to the organic layer and the inorganic layer. The thickness of the barrier laminate is preferably 0.5 μm to 10 μm and more preferably 1 μm to 5 μm.

(Organic Layer)

The organic layer can be formed, preferably, by curing a polymerizable composition including a polymerizable compound.

(Polymerizable Compound)

It is preferable that the polymerizable compound is a compound having an ethylenically unsaturated bond at a terminal or a side chain and/or a compound having epoxy or oxetane at a terminal or a side chain. It is more preferable that the polymerizable compound is a compound having an ethylenically unsaturated bond at a terminal or a side chain. Examples of the compound having an ethylenically unsaturated bond at a terminal or a side chain include a (meth) acrylate compound, an acrylamide compound, a styrene compound, and maleic anhydride. Among these, a (meth) acrylate compound is preferable, and an acrylate compound is more preferable.

As the (meth)acrylate compound, for example, (meth) acrylate, urethane (meth)acrylate, polyester (meth)acrylate, or epoxy (meth)acrylate is preferable.

As the styrene compound, for example, styrene, α-methylstyrene, 4-methylstyrene, divinylbenzene, 4-hydroxystyrene, or 4-carboxystyrene is preferable.

As the (meth)acrylate compound, specifically, for example, a compound described in paragraphs "0024" to "0036" of JP2013-43382A or paragraphs "0036" to "0048" of JP2013-43384A can be used. In addition, a polyfunctional acrylic monomer having a fluorene skeleton described in WO2013/047524 can also be used.

(Polymerization Initiator)

The polymerizable composition for forming an organic layer may include a polymerization initiator. When the polymerization initiator is used, the content thereof is preferably 0.1 mol % or higher and more preferably 0.5 mol % to 5 mol % with respect to the total amount of the compound contributing to the polymerization. With this composition, a polymerization reaction during which an active component-producing reaction occurs can be appropriately controlled. Examples of a polymerization initiator include IRGACURE series manufactured by Ciba Specialty Chemicals Inc. (for example, IRGACURE 651, IRGACURE 754, IRGACURE 184, IRGACURE 2959, IRGACURE 907, IRGACURE 369, IRGACURE 379, and IRGACURE 819), DAROCUR series (for example, DAROCUR TPO and DAROCUR 1173), QUANTACURE PDO, and EZACURE series manufactured by Lamberti S.p.A. (for example, EZACURE TZM, EZACURE TZT, and EZACURE KTO46).

(Silane Coupling Agent)

The polymerizable composition for forming an organic layer may include a silane coupling agent. Preferable examples of the silane coupling agent include a compound having a structure in which a hydrolyzable reactive group such as a methoxy group, an ethoxy group, or an acetoxy group and a substituent which has one or more reactive groups selected from an epoxy group, a vinyl group, an amino group, a halogen group, a mercapto group, and a (meth)acryloyl group are bonded to the same silicon atom. It is more preferable that the silane coupling agent has a (meth)acryloyl group. Specific examples of the silane coupling agent include a silane coupling agent represented by Formula (1) in WO2013/146069A and a silane coupling agent represented by Formula (I) in WO2013/027786A.

A ratio of the silane coupling agent to solid contents (residue after volatile components are volatilized) of the polymerizable composition is preferably 0.1 mass % to 30 mass % and more preferably 1 mass % to 20 mass %.

(Method of Forming Organic Layer)

Typically, the organic layer may be formed by applying the polymerizable composition in the form of a layer to a support such as a substrate film or an inorganic layer. Examples of the application method include a dip coating method, an air knife coating method, a curtain coating method, a roller coating method, a wire bar coating method, a gravure coating method, a slide coating method, and an extrusion coating method (also called a die coating method) using a hopper described in U.S. Pat. No. 2,681,294A. Among these, an extrusion coating method can be preferably adopted.

The polymerizable composition may be cured by light (for example, ultraviolet rays), electron beams, or heat rays. It is preferable that the polymerizable composition is cured by light. In particular, it is preferable that the polymerizable composition is cured while heated at a temperature of 25° C. or higher (for example, 30° C. to 130° C.). By promoting the free movement of the polymerizable composition by heating, the polymerizable composition can be effectively cured, and the layers can be formed without damaging the substrate film and the like.

The irradiation light may be ultraviolet rays emitted from a high-pressure mercury lamp or a low-pressure mercury lamp. The irradiation energy is preferably 0.1 J/cm$^2$ or higher and more preferably 0.5 J/cm$^2$ or higher. The polymerization of the polymerizable compound is inhibited by oxygen in the air. Therefore, it is preferable that the oxygen concentration or oxygen partial pressure during the polymerization decreases. In a case where the oxygen concentration during the polymerization is decreased using a nitrogen substitution method, the oxygen concentration is preferably 2% or lower and more preferably 0.5% or lower. In a case where the oxygen partial pressure during the polymerization is decreased using an evacuation method, the total pressure is preferably 1000 Pa or lower and more preferably 100 Pa or lower. In addition, it is more preferable that ultraviolet polymerization is performed by irradiation at an energy of 0.5 J/cm$^2$ or higher under reduced pressure conditions of 100 Pa or lower.

The polymerization ratio of the polymerizable compound in the organic layer after the curing of the polymerizable composition is preferably 20 mass % or higher, more preferably 30 mass % or higher, and still more preferably 50 mass % or higher. The polymerization ratio described herein refers to a ratio of reacted polymerizable groups to all the polymerizable groups (for example, an acryloyl group and a methacryloyl group) in a monomer mixture. The polymerization ratio can be determined by an infrared absorption method.

It is preferable that the organic layer is smooth and has high hardness. Regarding the smoothness of the organic layer, the average roughness (Ra value) of a 1 μm×1 μm region is preferably less than 3 nm and more preferably less than 1 nm.

It is required that foreign matter such as particles and protrusions are not present on the surface of the organic layer. Therefore, it is preferable that the organic layer is formed in a clean room. The cleanliness is preferably class 10000 or lower and more preferably class 1000 or lower.

It is preferable that the hardness of the organic layer is high. it is known that, when the hardness of the organic layer is high, the inorganic layer is formed to be smooth, which improves barrier performance. The hardness of the organic layer can be represented as a microhardness based on a nano-indentation method. The microhardness of the organic layer is preferably 100 N/mm or higher and more preferably 150 N/mm or higher.

The thickness of the organic layer is not particularly limited. From the viewpoints of brittleness and light transmittance, the thickness of the organic layer is preferably 50 nm to 5000 nm, and more preferably 200 nm to 3500 nm.

(Lamination of Organic Layer and Inorganic Layer)

The organic layer and the inorganic layer can be laminated by sequentially repeating the formation of the organic layer and the inorganic layer according to the desired layer configuration.

(Functional Layer)

The gas barrier film or the barrier laminate may have a functional layer. The details of the functional layer will be described in paragraphs "0036" to "0038" of JP2006-289627A. Examples of other functional layers include a matting agent layer, a protective layer, a solvent resistant layer, an antistatic layer, a smoothing layer, an adhesion improving layer, a light shielding layer, an anti-reflection layer, a hard coat layer, a stress relaxation layer, an anti-fog layer, an antifouling layer, a printing object layer, an easily adhesive layer, and a slippery layer.

Examples

Hereinafter, the present invention will be described in detail using Examples. Materials, used amounts, ratios, treatment details, treatment procedures, and the like shown in the following Examples can be appropriately changed within a range not departing from the scope of the present invention. Accordingly, the scope of the present invention is not limited to the following specific examples.

[Preparation of Gas Barrier Film]

A plasma treatment for improving adhesion was performed on a single surface of polyethylene terephthalate (S10, manufactured by Toray Advanced Film Co., Ltd.) having a thickness of 75 μm. Next, a polymerizable composition including 15 mass % of a polymerizable compound (Compound I), 0.5 mass % of a polymerization initiator (ESACURE KTO46, manufactured by Lamberti S.p.A.), and 84.5 mass % of 2-butanone was applied to the surface of the polyethylene terephthalate to obtain a film such that the thickness of the dry film was 2000 nm. The obtained film was cured by being irradiated with ultraviolet rays at an irradiation amount of 0.5 J/cm$^2$ in a nitrogen atmosphere in which the oxygen content was 100 ppm or lower. As a result, a first organic layer was formed. A first inorganic layer (silicon nitride) was formed on the first organic layer using a capacitively coupled plasma CVD method (hereinafter, also referred to simply as "plasma CVD method"). By adjusting major film formation parameters of the plasma CVD method such as a gas flow ratio, a pressure, or a RF power, an inorganic layer having an interface configuration and a composition as shown in tables below was formed. Further, a second organic layer was formed on a surface of the first inorganic layer using the same method as that of the first organic layer.

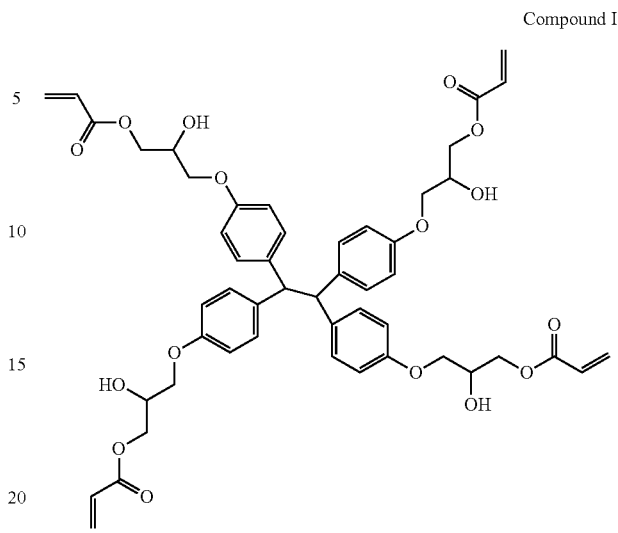

Compound I

In the plasma CVD method, silane (SiH$_4$), ammonia (NH$_3$), and hydrogen (H$_2$) were used as raw material gases. The raw material gas flow rates for forming the layers are shown in the table. In all of Examples and Comparative Examples, the pressure was set to 50 Pa, and the pressure adjustment was automatically performed regardless of the gas flow rate.

Regarding the control of the O proportion, the increase rate and the decrease rate of a RF power in a plasma CVD device were changed. As a result, a region having a predetermined variation of the O proportion was formed on both of a surface-side interface and a substrate-side interface of the inorganic layer. In the table, "Interface 1" refers to a surface-side (second organic layer side) oxygen-containing region of the inorganic layer, and "Interface 2" refers to a substrate-side (polyethylene terephthalate side) oxygen-containing region of the inorganic layer.

[Method of Measuring Variation of O Proportion]

Using an X-ray photoelectron spectrometer (ESCA-3400, manufactured by Shimadzu Corporation), the gas barrier film was analyzed by X-ray photoelectron spectroscopy (XPS) while Ar-ion etching it from a surface on the second organic layer side. As a result, atoms included in the inorganic layer interface regions were detected. In the measurement, it was determined that, when a signal of silicon atoms was detected, the etching of the inorganic layer was started. The O proportion was calculated based on the number of silicon atoms detected, the number of nitrogen atoms detected, the number of oxygen atoms detected, and the total number of silicon atoms, nitrogen atoms, and oxygen atoms detected. Further, the variation of the oxygen atom proportion per unit thickness was calculated based on a relationship between the thickness of the inorganic layer obtained by observation using a TEM (H-9000NAR, manufactured by Hitachi Ltd.) and the etching time.

[Measurement of Ratio of Si, N, H, and O in Uniform Region]

Using Rutherford backscattering (RBS) and hydrogen forward scattering (HFS) spectrometry (Pelletron 3 SDH, manufactured by National Electrostatics Corp.), the composition of the uniform region of the inorganic layer was analyzed to obtain a ratio of Si, N, O, and H in the organic layer. In the RBS spectrometry and the HFS spectrometry, it is necessary that a thick inorganic layer is formed to obtain the detection sensitivity. Therefore, for the measurement, another inorganic layer having a thickness, which was larger than the thickness of the center region of the inorganic layer of the gas barrier film prepared as described above in the thickness direction, that is, which was larger than the uniform region of the gas barrier film, was formed under the same film formation conditions to measure the ratio of Si, N, O, and H.

[Measurement of Density]

The density of the inorganic layer was determined based on X-ray reflectivity (XRR) measurement (ATX, manufactured by Rigaku Corporation). During the calculation of the density based on the XRR measurement results, a simulation (GXRR, simulation software manufactured by Rigaku Corporation) was performed assuming that: the substrate and the organic layer had the same density (1.3 g/cm$^3$); and the entire region of the inorganic layer had the same density.

[Barrier Performance After Bendability Test]

The obtained gas barrier film was bent under a condition of φ5 mm×1000 times to evaluate barrier performance. The barrier performance was evaluated using a method called a calcium corrosion method (refer to Asia Display/IDW'01, pp. 1435 to 1438) in which water permeation is evaluated by discoloration of metal calcium. Specifically, after metal calcium was vapor-deposited on a glass substrate, the glass substrate was sealed with a gas barrier film and was stored in an environment of temperature: 25° C. and humidity: 50% to obtain a sample. Using this sample, the water vapor transmission rate was calculated. That is, water which has passed through the gas barrier film reacts with metal calcium to produce calcium hydroxide. Calcium hydroxide converted from metal calcium is transparent. Therefore, by measuring the area of metal calcium discolored, the amount of water permeation can be calculated from the following reaction formula.

$$Ca+2H_2O \rightarrow Ca(OH)_2+H_2$$

The water vapor transmission rate (g/m$^2$·day) was calculated based on the amount of water permeation calculated as described above, the area of the barrier film, and the storage time. Since a time (induction time) is required for water to be diffused and reach an equilibrium state, the above-described measurement was performed based on the area of metal calcium discolored after the discoloration area rate of metal calcium became constant.

The barrier performance was evaluated based on the following criteria of the water vapor transmission rate after the bendability test.

A: lower than $5\times10^{-5}$
B: $5\times10^{-5}$ or higher and lower than $5\times10^{-4}$
C: $5\times10^{-4}$ or higher (unit: (g/m$^2$·day))

The obtained results and the preparation conditions of the gas barrier films are shown in Tables 1 to 6. In addition, FIG. 1 is a diagram showing the results of measuring variations of a Si proportion, a N proportion, and an O proportion in a thickness direction by XPS regarding an inorganic layer of a gas barrier film according to Example 5 in Tables 1 and 2.

TABLE 1

Variation of O Proportion and Barrier Performance

| | Interface 1 | | Uniform Region | | | | |
|---|---|---|---|---|---|---|---|
| | Variation of O Proportion nm | Thickness %/nm | Composition Si | N | H | O | Thickness nm |
| Comparative Example 1 | 1.1 | 20 | 1 | 0.95 | 0.85 | <0.1 | 5 |
| Comparative Example 2 | 1.1 | 20 | 1 | 0.95 | 0.85 | <0.1 | 10 |
| Comparative Example 3 | 1.1 | 20 | 1 | 0.95 | 0.85 | <0.1 | 50 |
| Comparative Example 4 | 2.1 | 15 | 1 | 0.95 | 0.85 | <0.1 | 5 |
| Example 1 | 2.1 | 15 | 1 | 0.95 | 0.85 | <0.1 | 10 |
| Comparative Example 5 | 2.9 | 10 | 1 | 0.95 | 0.85 | <0.1 | 5 |
| Example 2 | 2.9 | 10 | 1 | 0.95 | 0.85 | <0.1 | 10 |
| Comparative Example 6 | 4.9 | 8 | 1 | 0.95 | 0.85 | <0.1 | 5 |
| Example 3 | 4.9 | 8 | 1 | 0.95 | 0.85 | <0.1 | 10 |
| Comparative Example 7 | 6.2 | 6 | 1 | 0.95 | 0.85 | <0.1 | 5 |
| Example 4 | 6.2 | 6 | 1 | 0.95 | 0.85 | <0.1 | 10 |
| Example 5 | 6.2 | 6 | 1 | 0.95 | 0.85 | <0.1 | 20 |
| Example 6 | 6.2 | 6 | 1 | 0.95 | 0.85 | <0.1 | 30 |
| Example 7 | 6.2 | 6 | 1 | 0.95 | 0.85 | <0.1 | 50 |
| Comparative Example 8 | 8.2 | 4 | 1 | 0.95 | 0.85 | <0.1 | 5 |
| Example 8 | 8.2 | 4 | 1 | 0.95 | 0.85 | <0.1 | 10 |
| Comparative Example 9 | 11.6 | 3 | 1 | 0.95 | 0.85 | <0.1 | 5 |
| Comparative Example 10 | 11.6 | 3 | 1 | 0.95 | 0.85 | <0.1 | 10 |

| | Interface 2 | | | Barrier Performance | | |
|---|---|---|---|---|---|---|
| | Variation of O Proportion %/nm | Thickness nm | Total Thickness nm | g/m$^2$·day Immediately After Preparation | After Bending | Evaluation |
| Comparative Example 1 | 1.2 | 20 | 45 | 1.E−02 | 1.E−02 | C |
| Comparative Example 2 | 1.2 | 20 | 50 | 3.E−04 | 8.E−04 | C |
| Comparative Example 3 | 1.2 | 20 | 90 | 1.E−05 | 1.E−03 | C |
| Comparative Example 4 | 2.3 | 15 | 35 | 1.E−02 | 1.E−02 | C |
| Example 1 | 2.3 | 15 | 40 | 3.E−05 | 4.E−05 | A |
| Comparative Example 5 | 3 | 10 | 25 | 1.E−02 | 1.E−02 | C |
| Example 2 | 3 | 10 | 30 | 2.E−05 | 3.E−05 | A |
| Comparative Example 6 | 4.8 | 8 | 21 | 1.E−02 | 1.E−02 | C |

TABLE 1-continued

Variation of O Proportion and Barrier Performance

| | | | | | | |
|---|---|---|---|---|---|---|
| Example 3 | 4.8 | 8 | 26 | 9.E−06 | 1.E−05 | A |
| Comparative Example 7 | 6 | 6 | 17 | 1.E−02 | 1.E−02 | C |
| Example 4 | 6 | 6 | 22 | 8.E−06 | 9.E−06 | A |
| Example 5 | 6 | 6 | 32 | 7.E−06 | 7.E−06 | A |
| Example 6 | 6 | 6 | 42 | 7.E−06 | 8.E−06 | A |
| Example 7 | 6 | 6 | 62 | 6.E−06 | 5.E−05 | B |
| Comparative Example 8 | 8.1 | 4 | 13 | 1.E−02 | 1.E−02 | C |
| Example 8 | 8.1 | 4 | 18 | 1.E−05 | 9.E−05 | B |
| Comparative Example 9 | 11.4 | 3 | 11 | 1.E−02 | 1.E−02 | C |
| Comparative Example 10 | 11.4 | 3 | 16 | 1.E−05 | 3.E−03 | C |

TABLE 2

Preparation Conditions

| | Interface 1 Increase | Formation of Uniform Region | | | | Interface 2 Decrease |
|---|---|---|---|---|---|---|
| | | Raw Material Gas Flow Rate sccm (Standard State 0° C., 1 atm) | | | Power | |
| | Time s | $SiH_4$ | $NH_3$ | $H_2$ | kW | Time s |
| Comparative Example 1 | 8 | 150 | 350 | 500 | 2.5 | 1 | 8 |
| Comparative Example 2 | 8 | 150 | 350 | 500 | 2.5 | 2 | 8 |
| Comparative Example 3 | 8 | 150 | 350 | 500 | 2.5 | 10 | 8 |
| Comparative Example 4 | 6 | 150 | 350 | 500 | 2.5 | 1 | 6 |
| Example 1 | 6 | 150 | 350 | 500 | 2.5 | 2 | 6 |
| Comparative Example 5 | 4 | 150 | 350 | 500 | 2.5 | 1 | 4 |
| Example 2 | 4 | 150 | 350 | 500 | 2.5 | 2 | 4 |
| Comparative Example 6 | 3 | 150 | 350 | 500 | 2.5 | 1 | 3 |
| Example 3 | 3 | 150 | 350 | 500 | 2.5 | 2 | 3 |
| Comparative Example 7 | 2 | 150 | 350 | 500 | 2.5 | 1 | 2 |
| Example 4 | 2 | 150 | 350 | 500 | 2.5 | 2 | 2 |
| Example 5 | 2 | 150 | 350 | 500 | 2.5 | 4 | 2 |
| Example 6 | 2 | 150 | 350 | 500 | 2.5 | 6 | 2 |
| Example 7 | 2 | 150 | 350 | 500 | 2.5 | 10 | 2 |
| Comparative Example 8 | 1.5 | 150 | 350 | 500 | 2.5 | 1 | 1.5 |
| Example 8 | 1.5 | 150 | 350 | 500 | 2.5 | 2 | 1.5 |
| Comparative Example 9 | 1 | 150 | 350 | 500 | 2.5 | 1 | 1 |
| Comparative Example 10 | 1 | 150 | 350 | 500 | 2.5 | 2 | 1 |

TABLE 3

Ratio of Si, N, H, and O, in Uniform Region of Inorganic Layer, and Barrier Performance

| | Interface 1 | | Uniform Region | | | | |
|---|---|---|---|---|---|---|---|
| | Variation of O Proportion | Thickness | Composition | | | | Thickness |
| | %/nm | nm | Si | N | H | O | nm |
| Example 9 | 6.2 | 6 | 1 | 0.7 | 0.85 | <0.1 | 20 |
| Example 10 | 6.2 | 6 | 1 | 0.8 | 0.85 | <0.1 | 20 |
| Example 11 | 6.2 | 6 | 1 | 0.9 | 0.85 | <0.1 | 20 |
| Example 12 | 6.2 | 6 | 1 | 1 | 0.85 | <0.1 | 20 |
| Example 13 | 6.2 | 6 | 1 | 1.1 | 0.85 | <0.1 | 20 |
| Example 14 | 6.2 | 6 | 1 | 1.2 | 0.85 | <0.1 | 20 |
| Example 15 | 6.2 | 6 | 1 | 0.95 | 0.7 | <0.1 | 20 |
| Example 16 | 6.2 | 6 | 1 | 0.95 | 0.8 | <0.1 | 20 |
| Example 17 | 6.2 | 6 | 1 | 0.95 | 0.9 | <0.1 | 20 |

TABLE 3-continued

Ratio of Si, N, H, and O, in Uniform Region of Inorganic Layer, and Barrier Performance

| | | | | | | | |
|---|---|---|---|---|---|---|---|
| Example 18 | 6.2 | 6 | 1 | 0.95 | 1 | <0.1 | 20 |
| Example 19 | 6.2 | 6 | 1 | 0.95 | 1 | 0.2 | 20 |

| | Interface 2 | | | Barrier Performance | | |
|---|---|---|---|---|---|---|
| | Variation of O Proportion %/nm | Thickness nm | Total Thickness nm | Immediately After preparation (g/m²·day) | After Bending (g/m²·day) | Evaluation |
| Example 9 | 6 | 6 | 32 | 1.E−04 | 1.E−04 | B |
| Example 10 | 6 | 6 | 32 | 7.E−05 | 7.E−05 | B |
| Example 11 | 6 | 6 | 32 | 8.E−06 | 8.E−06 | A |
| Example 12 | 6 | 6 | 32 | 9.E−06 | 1.E−05 | A |
| Example 13 | 6 | 6 | 32 | 2.E−05 | 8.E−05 | B |
| Example 14 | 6 | 6 | 32 | 2.E−05 | 5.E−04 | B |
| Example 15 | 6 | 6 | 32 | 1.E−05 | 9.E−05 | B |
| Example 16 | 6 | 6 | 32 | 8.E−06 | 9.E−06 | A |
| Example 17 | 6 | 6 | 32 | 8.E−06 | 8.E−06 | A |
| Example 18 | 6 | 6 | 32 | 9.E−05 | 1.E−04 | B |
| Example 19 | 6 | 6 | 32 | 3.E−04 | 4.E−04 | B |

TABLE 4

Preparation Conditions

| | Interface 1 Increase | Formation of Uniform Region | | | | | Interface 2 Decrease |
|---|---|---|---|---|---|---|---|
| | | Raw Material Gas Flow Rate sccm (Standard State 0° C., 1 atm) | | | Power | | |
| | Time s | $SiH_4$ | $NH_3$ | $H_2$ | kW | Time s | Time s |
| Example 9 | 2 | 225 | 350 | 500 | 2.8 | 4 | 2 |
| Example 10 | 2 | 200 | 350 | 500 | 2.7 | 4 | 2 |
| Example 11 | 2 | 175 | 350 | 500 | 2.6 | 4 | 2 |
| Example 12 | 2 | 125 | 350 | 500 | 2.5 | 4 | 2 |
| Example 13 | 2 | 100 | 350 | 500 | 2.4 | 4 | 2 |
| Example 14 | 2 | 75 | 350 | 500 | 2.3 | 4 | 2 |
| Example 15 | 2 | 150 | 350 | 500 | 3 | 3 | 2 |
| Example 16 | 2 | 150 | 350 | 500 | 2.8 | 4 | 2 |
| Example 17 | 2 | 150 | 350 | 500 | 2 | 6 | 2 |
| Example 18 | 2 | 150 | 350 | 500 | 1 | 12 | 2 |
| Example 19 | 2 | 150 | 350 | 500 | 0.6 | 16 | 2 |

TABLE 5

Density and Barrier Performance

| | Interface 1 | | Uniform Region | | | | | Interface 2 | |
|---|---|---|---|---|---|---|---|---|---|
| | Variation of O Proportion %/nm | Thickness nm | Composition | | | | Thickness nm | Variation of O Proportion %/nm | Thickness nm |
| | | | Si | N | H | O | | | |
| Example 20 | 6.2 | 6 | 1 | 0.95 | 0.85 | <0.1 | 20 | 6 | 6 |
| Example 5 | 6.2 | 6 | 1 | 0.95 | 0.85 | <0.1 | 20 | 6 | 6 |
| Example 21 | 6.2 | 6 | 1 | 0.95 | 0.85 | <0.1 | 20 | 6 | 6 |
| Example 22 | 6.2 | 6 | 1 | 0.95 | 0.85 | <0.1 | 20 | 6 | 6 |

| | Total Thickness nm | Density g/cm | Barrier Performance (g/m²·day) | | Evaluation |
|---|---|---|---|---|---|
| | | | Immediately After Preparation | After Bending | |
| Example 20 | 32 | 2 | 5.E−05 | 5.E−05 | B |
| Example 5 | 32 | 2.1 | 7.E−06 | 7.E−06 | A |
| Example 21 | 32 | 2.4 | 7.E−06 | 8.E−06 | A |

TABLE 5-continued

| | Density and Barrier Performance | | | | |
|---|---|---|---|---|---|
| Example 22 | 32 | 2.6 | 8.E−06 | 9.E−04 | B |

TABLE 6

| | Preparation Conditions | | | | | |
|---|---|---|---|---|---|---|
| | Formation of Uniform Region | | | | | |
| | Interface 1 Increase | Raw Material Gas Flow Rate sccm (Standard State 0° C., 1 atm) | | | Power | Interface 2 Decrease |
| | Time s | $SiH_4$ | $NH_3$ | $H_2$ | kW | Time s | Time s |
| Example 20 | 2 | 150 | 350 | 200 | 2.5 | 4 | 2 |
| Example 5 | 2 | 150 | 350 | 500 | 2.5 | 4 | 2 |
| Example 21 | 2 | 150 | 350 | 800 | 2.5 | 4 | 2 |
| Example 22 | 2 | 150 | 350 | 1200 | 2.5 | 5 | 2 |

What is claimed is:

1. A gas barrier film comprising a substrate film and an inorganic layer,
   wherein the inorganic layer includes Si, N, H, and O,
   the inorganic layer includes a uniform region in which a ratio of Si, N, H, and O is uniform and an O proportion represented by the following expression is 10% or lower, at the center in a thickness direction,
   either or both of interface-contact regions of the inorganic layer are oxygen-containing regions in which the O proportion represented by the following expression increases in a direction from the uniform region side to an interface and in which a variation of the O proportion per unit thickness is 2%/nm to 8%/nm, and
   the uniform region has a thickness of more than 5 nm,
   wherein O Proportion: (Number of O/Total Number of Si, N, and O)×100%.

2. The gas barrier film according to claim 1,
   wherein both interface-contact regions of the inorganic layer are the oxygen-containing regions.

3. The gas barrier film according to claim 2,
   wherein a composition of the uniform region is represented by $SiN_xH_yO_z$, in which $0.8 \leq x \leq 1.1$, and $z < 0.1$.

4. The gas barrier film according to claim 3,
   wherein the composition of the uniform region is represented by $SiN_xH_yO_z$, in which $0.9 \leq x \leq 1.0$, $0.8 \leq y \leq 0.9$, and $z < 0.1$.

5. The gas barrier film according to claim 4,
   wherein the inorganic layer has a density of 2.1 $g/cm^3$ to 2.4 $g/cm^3$.

6. The gas barrier film according to claim 3,
   wherein the inorganic layer has a density of 2.1 $g/cm^3$ to 2.4 $g/cm^3$.

7. The gas barrier film according to claim 2,
   wherein the inorganic layer has a density of 2.1 $g/cm^3$ to 2.4 $g/cm^3$.

8. The gas barrier film according to claim 1,
   wherein the oxygen-containing regions have a thickness of 4 nm to 15 nm.

9. The gas barrier film according to claim 1,
   wherein the inorganic layer has a thickness of 15 run to 65 nm.

10. The gas barrier film according to claim 1,
    wherein the inorganic layer has a thickness of 20 nm to 40 nm.

11. The gas barrier film according to claim 1,
    wherein a composition of the uniform region is represented by $SiN_xH_yO_z$, in which $0.8 \leq x \leq 1.1$, $0.7 \leq y \leq 0.9$, and $z < 0.1$.

12. The gas barrier film according to claim 11,
    wherein the composition of the uniform region is represented by $SiN_xH_yO_z$, in which $0.9 \leq x \leq 1.0$, $0.8 \leq y \leq 0.9$, and $z < 0.1$.

13. The gas barrier film according to claim 12,
    wherein the inorganic layer has a density of 2.1 $g/cm^3$ to 2.4 $g/cm^3$.

14. The gas barrier film according to claim 11,
    wherein the inorganic layer has a density of 2.1 $g/cm^3$ to 2.4 $g/cm^3$.

15. The gas barrier film according to claim 1,
    wherein the inorganic layer has a density of 2.1 $g/cm^3$ to 2.4 $g/cm^3$.

16. The gas barrier film according to claim 1 comprising a barrier laminate including the inorganic layer and at least one organic layer.

* * * * *